United States Patent
Kidney et al.

(10) Patent No.: US 8,566,673 B2
(45) Date of Patent: Oct. 22, 2013

(54) METHOD FOR IMPROVING PERFORMANCE IN RAID SYSTEMS

(75) Inventors: Kevin Kidney, Lafayette, CO (US); Kenneth Day, Wichita, KS (US)

(73) Assignee: LSI Corporation, San Jose, CA (US)

( * ) Notice: Subject to any disclaimer, the term of this patent is extended or adjusted under 35 U.S.C. 154(b) by 119 days.

(21) Appl. No.: 13/197,830

(22) Filed: Aug. 4, 2011

(65) Prior Publication Data

US 2013/0036340 A1    Feb. 7, 2013

(51) Int. Cl.
    *G11C 29/00*    (2006.01)

(52) U.S. Cl.
    USPC ............... 714/770; 714/773; 714/766

(58) Field of Classification Search
    USPC ................... 714/770, 747, 773, 766
    See application file for complete search history.

(56) References Cited

U.S. PATENT DOCUMENTS

| | | | |
|---|---|---|---|
| 5,265,247 A * | 11/1993 | Wienck et al. ................ | 1/1 |
| 5,375,128 A * | 12/1994 | Menon et al. ................. | 714/770 |
| 7,516,354 B2 * | 4/2009 | Nguyen et al. ............... | 714/6.24 |
| 7,721,146 B2 | 5/2010 | Polisetti et al. | |
| 7,761,736 B2 * | 7/2010 | Nguyen et al. ............... | 714/6.12 |
| 8,201,001 B2 * | 6/2012 | McKean et al. ............... | 713/320 |
| 2009/0077443 A1 * | 3/2009 | Nguyen et al. ............... | 714/747 |
| 2011/0126083 A1 * | 5/2011 | Kawaguchi .................. | 714/770 |

OTHER PUBLICATIONS

Whitepaper Downloaded: "Silent Data Corruption in SATA Arrays: A Solution", RAID Incorporated; located at web address http://161.58.118/xanadu_II.php; Aug. 3, 2011.
Hafner, James Lee, "Weaver Codes: Highly Fault Tolerant Erasure Codes for Storage Systems", FAST '05: 4th USENIX Conference on File and Storage Technologies, USENIX Association, pp. 211-224.

* cited by examiner

*Primary Examiner* — Fritz Alphonse
(74) *Attorney, Agent, or Firm* — Suiter Swantz pc llo

(57) ABSTRACT

A method for computing and storing parity information in a RAID system includes dividing each segment in a stripe into a data block and a parity block, and storing in each parity block, parity information for a limited number of other data blocks in the stripe. A method for rebuilding data in a RAID system includes rebuilding the data from parity information and storing the rebuilt data on reserve portions of the remaining disks in the system.

21 Claims, 7 Drawing Sheets

METHOD FOR IMPROVING PERFORMANCE IN RAID SYSTEMS

FIELD OF THE INVENTION

The present invention is directed generally toward data storage systems and more particularly toward methods for recovering failed drives in a RAID system.

BACKGROUND OF THE INVENTION

RAID data storage systems are multi-disk storage systems that maintain data integrity even when a disk in the system fails. RAID storage systems maintain data integrity by storing parity information for all of the data. Parity information allows the system to rebuild all of the data from a failed disk based on the data stored in all of the other disks. Conventional methods for generating parity information involve dividing each disk into logical segments of equal size, associating one logical segment from each drive into a logical stripe, then performing an exclusive disjunction (commonly known as an XOR operation) on all of the logical segments in the logical stripe to produce one logical segment of parity information. The logical segment of parity information is stored in the same logical stripe on an unused disk. If any one disk fails, the logical segment of the logical stripe stored on that disk can be rebuilt by performing an exclusive disjunction on all of the remaining logical segments in that logical stripe.

This conventional method for generating parity information cannot survive more than one disk failure and may require significant processing time to rebuild a failed disk depending on the size of the system. Alternative methods for producing parity information can tolerate more than one disk failure, but each method sacrifices some amount of speed or efficiency in favor of fault tolerance. For example, RAID 6 storage systems maintain two independent segments of parity information for each logical stripe; one segment is produced using a complex mathematical algorithm. This method is tolerant of two disk failures but adds significant processing time to produce and update the second parity segment.

What is needed is a method for producing parity information that is tolerant of more than one disk failure, but that does not significantly degrade the efficiency of the data storage system during updates or rebuilds.

RAID systems usually include at least one powered and spinning but unused disk called a "hot spare" where the system can immediately begin rebuilding a failed disk. Rebuilding the data from a failed disk is a laborious, time consuming, energy intensive process. Because existing systems rebuild the failed disk on the hot spare, the speed of the rebuilding process is limited by the bandwidth of the hot spare. Furthermore, users continue to access the RAID system during the rebuilding process, further consuming disk bandwidth and increasing rebuild time.

Consequently, it would be advantageous if a method existed that was suitable for rebuilding multiple segments of a failed disk in parallel.

SUMMARY OF THE INVENTION

Accordingly, the present invention is directed to a novel method for producing parity information that is tolerant of more than one disk failure, but that does not significantly degrade the efficiency of the data storage system during updates or rebuilds. And a novel method for rebuilding multiple segments of a failed disk in parallel.

Each disk in a RAID data storage system is divided into segments and each segment is associated with a stripe containing one segment from each disk. Each segment stores a data block and a parity block for a limited number of data blocks in other segments of the stripe. The number of segments containing parity information for each data block determines fault tolerance. By this method a RAID system may tolerate more than one disk failure, and update and rebuild operations may be less processor and bandwidth intensive than similarly tolerant conventional RAID systems.

Furthermore, each disk in a RAID data storage system may retain a reserve segment of spare capacity. In the event of a disk failure, the RAID system rebuilds segments of the failed disk on the reserve segments of each of the remaining disks. By this method, the excess load of rebuilding the failed disk is spread over the entire system rather than being localized in a single hot spare disk.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles.

BRIEF DESCRIPTION OF THE DRAWINGS

The numerous objects and advantages of the present invention may be better understood by those skilled in the art by reference to the accompanying figures in which.

DETAILED DESCRIPTION OF THE INVENTION

Reference will now be made in detail to the subject matter disclosed, which is illustrated in the accompanying drawings. The scope of the invention is limited only by the claims; numerous alternatives, modifications and equivalents are encompassed. For the purpose of clarity, technical material that is known in the technical fields related to the embodiments has not been described in detail to avoid unnecessarily obscuring the description.

Figure 1:
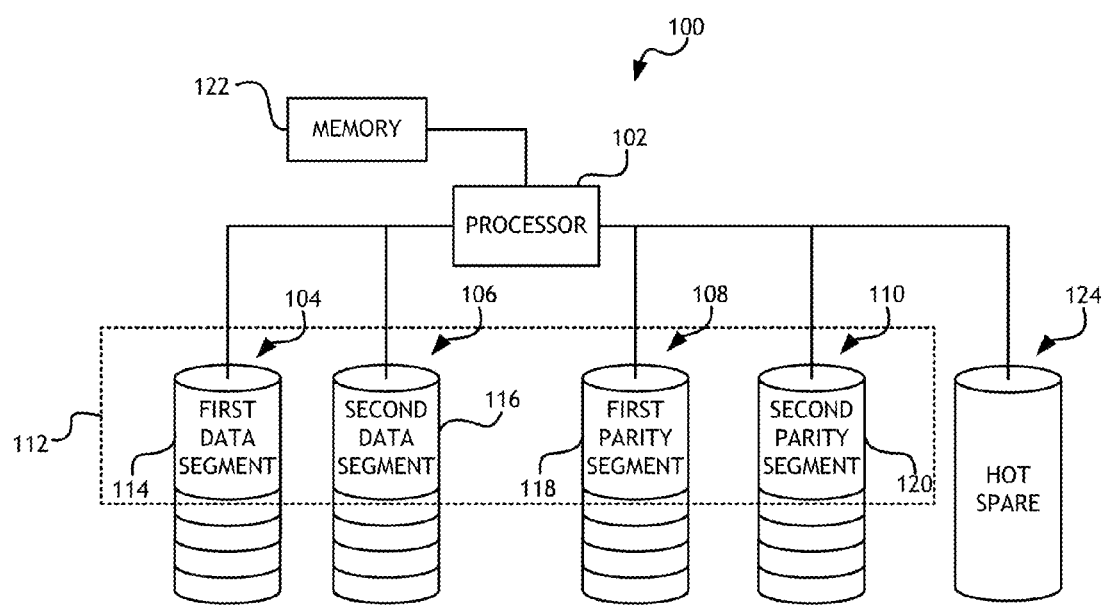
FIG. 1 shows a block diagram of a conventional RAID data storage system.

Referring to FIG. 1, a conventional RAID system 100 includes a processor 122, memory 122 storing firmware, and a plurality of disks 104, 106, 108, 110. The disks 104, 106, 108, 110 are divided into segments 114, 116, 118, 120 of equal size and organized into "stripes" 112 such that a stripe 112 contains one segment 114, 116, 118, 120 from each disk 104, 106, 108, 110. Typically a stripe 112 contains one or two parity segments 118, 120 and the remaining segments 114, 116 store data. At least one parity segment, such as the first parity segment 118, contains parity information generated by performing an exclusive disjunction operation on all of the data segments 114, 116. A RAID system 100 may contain a second parity segment 120. The second parity segment 120 may mirror the parity information contained in the first parity segment 118 or it may contain independent parity information generated by performing some type of mathematical field operation on all of the data segments 104, 106 and then performing an exclusive disjunction operation. FIG. 1 shows a RAID system having four disks but in practice a RAID system 100 may include hundreds of disks.

In the even of a disk failure, the RAID system 100 rebuilds the data segment from the failed disk by performing an exclusive disjunction operation on the first parity segment 118 and all of the remaining data segments. The system 100 then stores the rebuilt data segment on a hot spare disk 124. The segment of the hot spare disk 124 that contains the rebuilt data segment then becomes part of the stripe 112.

When a disk fails in a RAID system or a RAID group having many disks, the process of rebuilding even a single data segment is very time consuming and processor intensive. Rebuilding one data segment requires processing data segments in the same stripe from all of the remaining disks. Furthermore, when a disk fails the entire disk must be rebuilt, so in practice all of the data segments in the RAID system must be processed. Reading all of the data from each of the remaining disks severely degrades performance of the RAID system.

In addition to the extensive time and processing power required to read all of the data from each of the remaining disks, writing the rebuilt data to a single hot spare disk 124 creates a bottleneck. Maintaining a hot spare disk 124 also adds to the running cost of the system.

In a RAID system having two independent parity disks, the system can tolerate two disk failures. Recovering two disk failures is even more processor intensive than a single disk failure because in addition to reading all of the data stored on each of the remaining disks, the system must perform complex mathematical operations on the data. Also, rebuilding two failed disks on a single hot spare 124 may involve rebuilding multiple segments from the same stripe on a single disk, compromising the fault tolerance of the system; in that case, the RAID system may require two hot spares, further increasing the running cost of the system.

Figure 2:
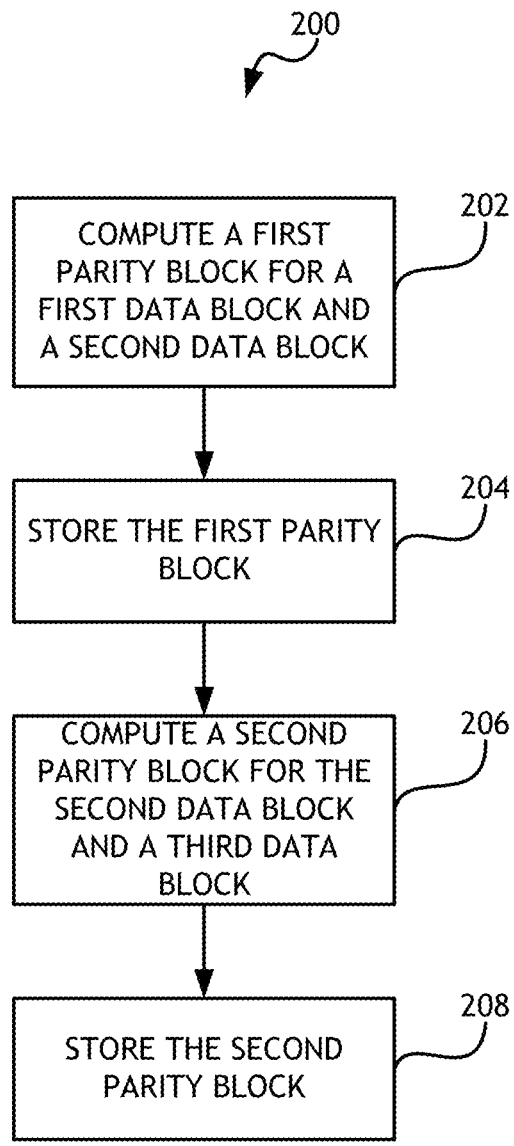
FIG. 2 shows a flowchart for a method of storing parity information according to the present invention.

Referring to FIG. 2, a method 200 is shown for creating and storing parity information for less than an entire stripe in a RAID system having a processor, memory and a plurality of disks, each divided into segments. Segments in the RAID system are organized into stripes such that each stripe includes one segment from each disk. Each segment may contain a data block and a parity block. Each parity block may contain parity information for several data blocks from the other segments in the stripe. In this embodiment, the processor may compute 202 parity information by performing an exclusive disjunction operation on a first data block and a second data block in the stripe. The processor may then store 204 the parity information in a first parity block in one segment in the stripe. Neither the first data block nor the second data block may be in the same segment as the first parity block. The processor may then compute 206 parity information by performing an exclusive disjunction operation on the second data block and a third data block in the stripe. The processor may then store 204 the parity information in a second parity block in one segment in the stripe. Neither the second data block nor the third data block may be in the same segment as the second parity block; however, the second parity block may be in the same segment as the first data block. Parity information created and stored by this method allows a RAID system to rebuild lost data blocks without reading an entire stripe. Rebuild operations are therefore more efficient for RAID systems utilizing this method.

Figure 3:
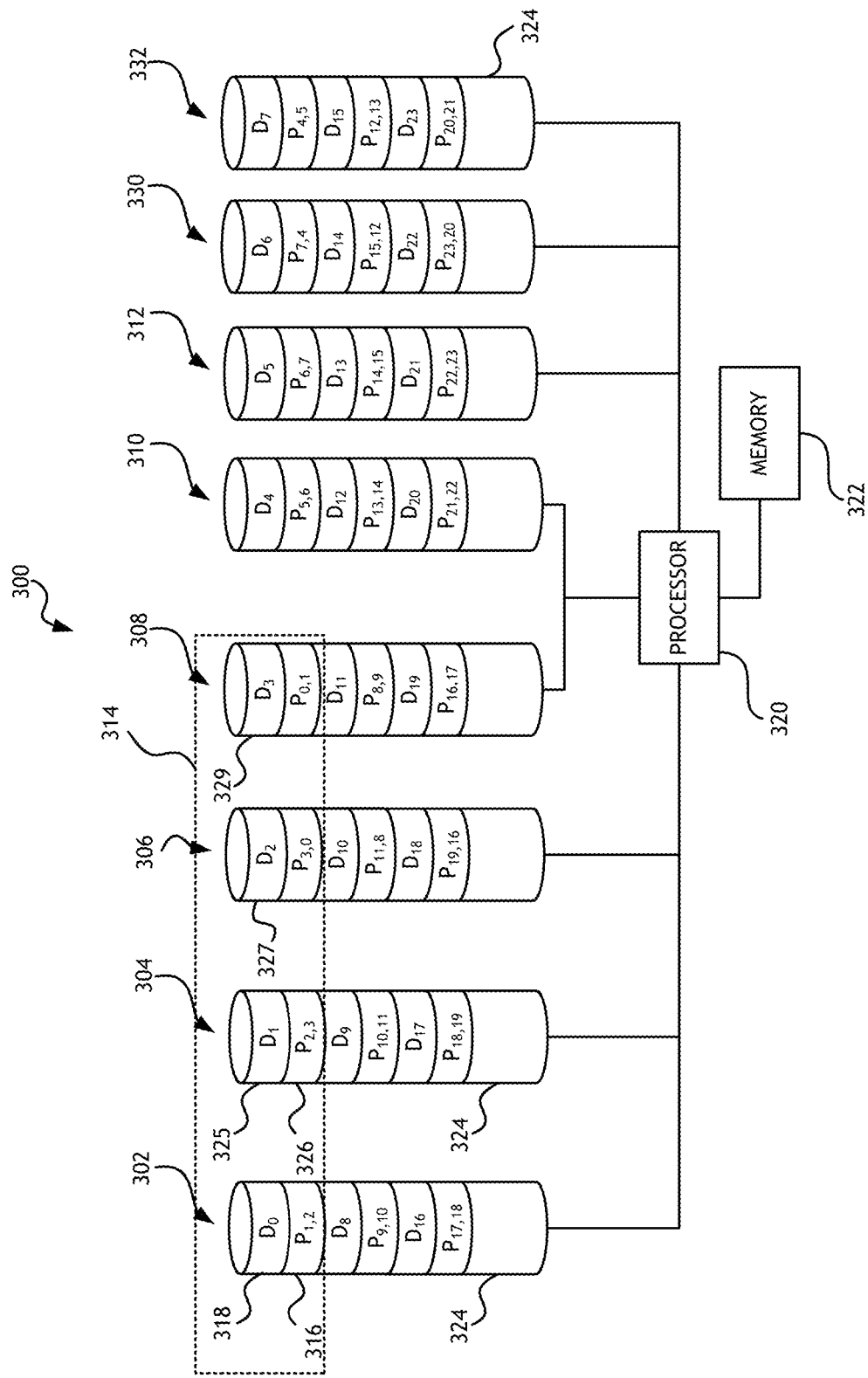
FIG. 3 shows a bock diagram of a RAID data storage system with data organized according to the method of FIG. 2.

Referring to FIG. 3, a RAID system 300 utilizing this method may have a processor 320, memory 322, and a plurality of disks 302, 304, 306, 308, 310, 312, 330 and 332. Each disk 302, 304, 306, 308, 310, 312, 330 and 332 may be divided into segments, and each segment divided into two blocks. The segments may be organized into fixed size stripes 314. In this embodiment, a first parity block 316 may contain parity information generated from a first data block 325 and a second data block 327. A second parity block 326 may contain parity information generated from the second data block 327 and a third data block 329. Note that each segment contains a parity block with parity information generated from data blocks in the same stripe but different segments. Furthermore, each data block may be used to generate parity information for at least two parity blocks. The fault tolerance of this embodiment is dependent on the number of parity blocks each data block is used to generate provided parity information exists for each data block and enough data blocks remain to recover at least one data block from a failed disk. The embodiment shown in FIG. 3 may tolerate two failed disks. One skilled in the art will appreciate that while FIG. 3 shows parity information generated from the succeeding two data blocks, there is no requirement that parity information be generated from sequential data blocks, only that parity blocks cannot be stored in the same segment as any data block used to generate the parity information. Each disk 302, 304, 306, 308, 310, 312, 330 and 332 may also contain one or more reserve segments 324. Reserve segments 324 may be used to rebuild segments of a failed disk as further described herein.

Figure 4:
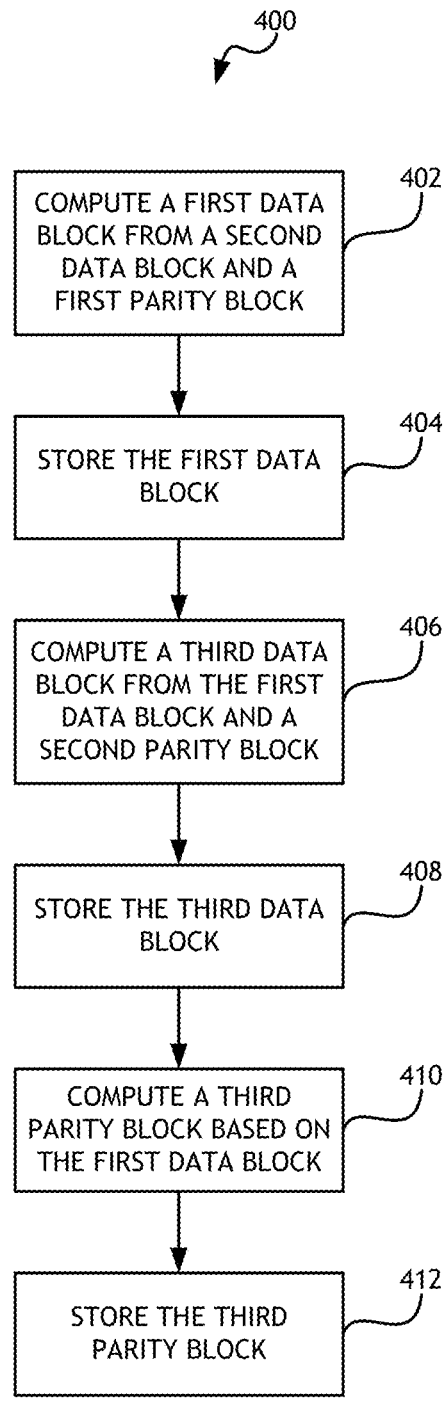
FIG. 4 shows a flowchart for a method of rebuilding data from parity information stored according to the method of FIG. 2.

Referring to FIG. 4, a method 400 is shown for rebuilding data blocks from a failed disk in a RAID system having segments divided into data blocks and parity blocks. The system may compute 402 a first data block by performing an exclusive disjunction operation on a second data block and a first parity block. The first parity block may contain parity information previously generated by performing an exclusive disjunction operation on the first data block and the second data block. The system may then store 404 the rebuilt first data block. In a RAID system utilizing a hot spare disk, the system may store the rebuilt first data block in a segment on the hot spare associated with the same stripe as the second data block and the first parity block. A similar process may be used to rebuild additional data blocks from the same failed disk but different stripes.

Under specific circumstances, a two disk failure in a RAID system utilizing the present invention may require the failed drives to be rebuilt in a specific order. This situation arises where the first failed disk contains one of the parity blocks generated using a data block from the second failed disk, and a data block from the first failed disk was used to generate the second parity block for the data block from the second failed disk. In this situation the data blocks may need to be rebuilt in a specific order. Continuing the example set forth supra, the system may compute 406 a third data block by performing an exclusive disjunction operation on the rebuilt first data block and a second parity block. The second parity block may contain parity information previously generated by performing an exclusive disjunction operation on the first data block and the third data block. The system may then store 408 the rebuilt third parity block. Having rebuilt both data blocks for a particular stripe, the system may compute 410 parity information for the first data block according to the methods set forth herein and store 412 the parity information in a third parity block satisfying the criteria of the present invention. These methods may be performed by a processor in a RAID system executing firmware configured to perform the steps described.

Figure 5A:
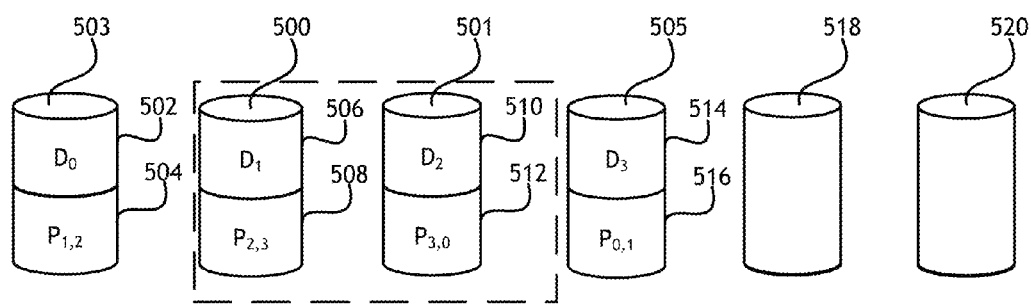
FIG. 5A-5C show progressive steps for rebuilding data in RAID system after two disk failures.
Figure 5B:
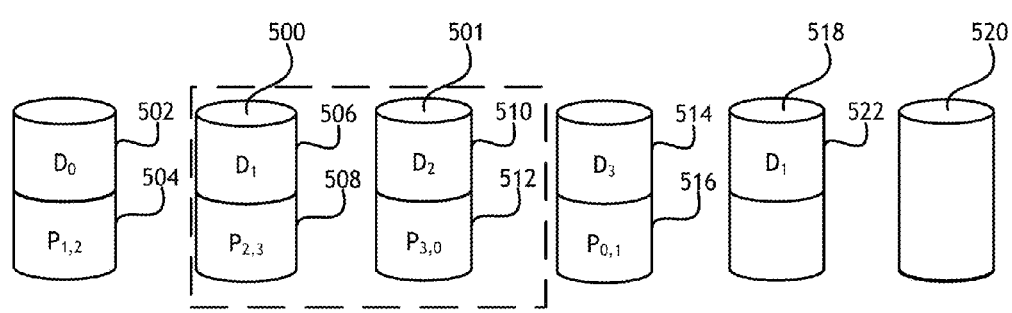
Figure 5C:
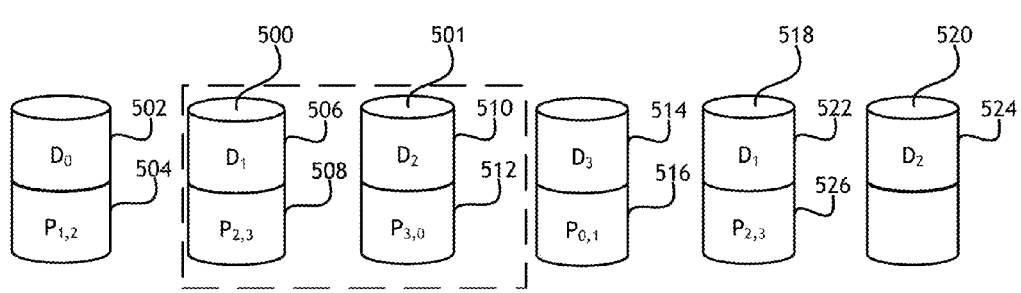

Referring to FIG. 5A, FIG. 5B and FIG. 5C, an illustration of the method described in FIG. 4 is shown for one stripe during a two disk failure in a RAID system tolerant of two faults. Referring to FIG. 5A, a first failed disk 500 contains data block $D_1$ 506 and parity block $P_{2,3}$ 508. Parity block $P_{2,3}$ 508 contains parity information generated by performing an exclusive disjunction operation on data blocks $D_2$ 510 and $D_3$ 514. A second failed disk 501 contains data block $D_2$ 510 and parity block $P_{3,0}$ 512. Parity block $P_{3,0}$ 512 contains parity information generated by performing an exclusive disjunction operation on data blocks $D_3$ 514 and $D_o$ 502. A first live disk 503 contains data block $D_0$ 502 and parity block $P_{1,2}$ 504. Parity block $P_{1,2}$ 504 contains parity information generated by performing an exclusive disjunction operation on data blocks $D_1$ 506 and $D_2$ 510. A second live disk 505 contains data block $D_3$ 514 and parity block $P_{0,1}$ 516. Parity block $P_{0,1}$ 516 contains parity information generated by performing an exclusive disjunction operation on data blocks $D_o$ 502 and $D_1$ 506. For this illustration, two unused disks 518, 520 are also shown to clearly illustrate the rebuilding process; in actual application a RAID system implementing the present invention may have no unused disks. A RAID system implementing the present invention would rebuild data blocks on reserve portions of disks actively utilized by the RAID system, allowing segments from multiple stripes on each failed disk to be rebuilt in parallel.

Data block $D_2$ 510 could be rebuilt by performing an exclusive disjunction operation on data block $D_3$ 514 and parity block $P_{2,3}$ 508, or by performing an exclusive disjunction operation on data block $D_1$ 506 and parity block $P_{1,2}$ 504. In this case, neither of these operations can be performed because the first failed disk 500 contains both data block $D_1$ 506 and parity block $P_{2,3}$ 508. Therefore, data block $D_2$ 510 cannot be rebuilt until data block $D_1$ 506 has been rebuilt.

Referring to FIG. 5B, data block $D_1$ 506 may be rebuilt by performing an exclusive disjunction operation on data block $D_0$ 502 and parity block $P_{0,1}$ 516. Rebuilt data block $D_1$ 522 may then be stored on a first unused disk 518. With data block $D_1$ rebuilt, enough information exists to rebuild data block $D_2$ 510.

Referring to FIG. 5C, data block $D_2$ 510 may be rebuilt by performing an exclusive disjunction operation on rebuilt data block $D_1$ 522 and parity block $P_{1,2}$ 504. Rebuilt data block $D_2$ 524 may then be stored on a second unused disk 520. With all of the data blocks rebuilt, the system may proceed to rebuild lost parity information by performing an exclusive disjunction operation on rebuilt data block $D_2$ 522 and data block $D_3$ 514. The system may then store the rebuilt parity block $P_{2,3}$ 526 on the first unused disk 518, in the same segment as data block $D_1$ 522. One skilled in the art will appreciate that while a RAID system with two disk fault tolerance is shown in FIG. 5A, FIG. 5B and FIG. 5C, similar principals would apply to RAID systems with arbitrarily large fault tolerance provided all the criteria set forth supra are satisfied.

Conventional RAID systems maintain a hot spare disk to immediately begin rebuilding lost data in the event of a disk failure. Hot spare disks must be kept running and accessible at all times, but are not routinely utilized by the RAID system. Furthermore, a single hot spare disk becomes a bottleneck during a rebuild operation.

Figure 6:
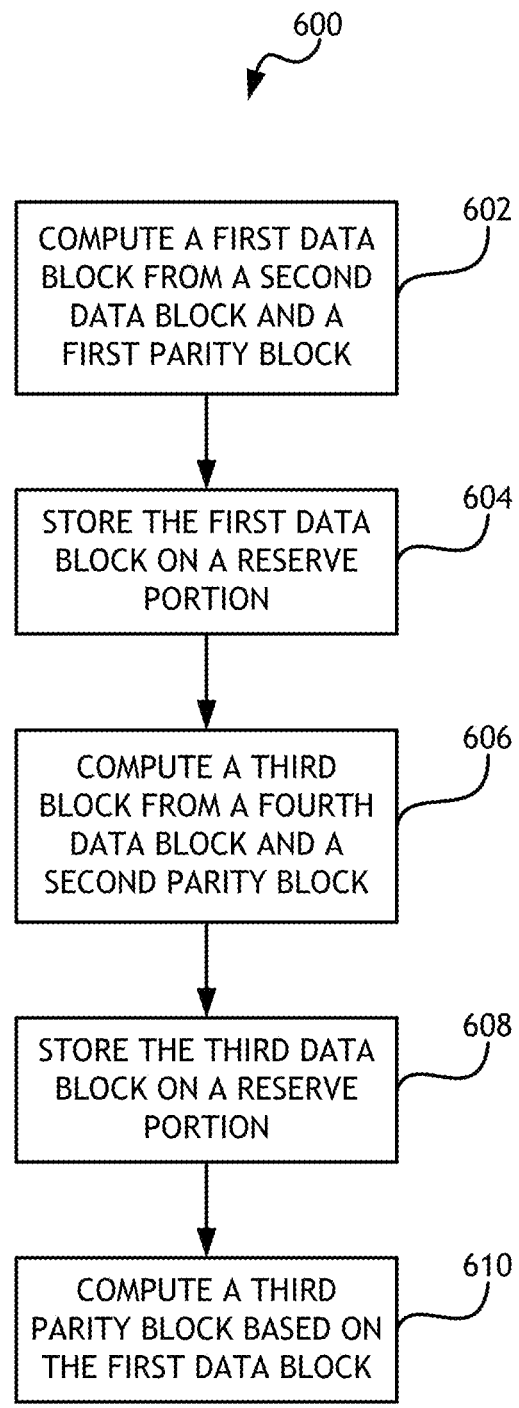
FIG. 6 shows a flowchart of a method for rebuilding data from parity information onto reserve portions of existing disks in a RAID storage system.

Referring to FIG. 6, a method 600 is shown for rebuilding data blocks from one or more failed disks in a RAID system having segments divided into data blocks and parity blocks, where each disk in the RAID system includes a reserve portion at least large enough to accommodate one segment. The RAID system may refrain from storing data on the reserve portion of each disk, and retain the reserve portions for rebuilding data blocks in the event of a disk failure. Such a RAID system is illustrated in FIG. 3. The system may compute 602 a first data block by performing an exclusive disjunction operation on a second data block and a first parity block. The first parity block may contain parity information previously generated by performing an exclusive disjunction operation on the first data block and the second data block. The system may then store 604 the rebuilt first data block in the reserve portion of any disk in the RAID system that does not also contain parity information generated from the first data block. A similar process may be used to rebuild additional data blocks from the same failed disk but different stripes. For each stripe, rebuilt data blocks may be written to reserve portions of different disks. The system may therefore write multiple rebuilt data blocks at the same time.

In the event of multiple disk failures within the fault tolerance of the RAID system, sufficient data may not exist to rebuild one or more of the lost data blocks. In this situation, the data blocks may need to be rebuilt in a specific order. Continuing the example set forth supra, the system may compute 606 a third data block by performing an exclusive disjunction operation on the rebuilt first data block and a second parity block. The second parity block may contain parity information previously generated by performing an exclusive disjunction operation on the first data block and the third data block. The system may then store 608 the rebuilt third parity block in the reserve portion of any disk in the RAID system that does not also contain parity information generated from the first data block. Having rebuilt both data blocks for a particular stripe, the system may compute 610 parity information for the first data block according to the methods set forth herein and store 612 the parity information in a third parity block in the reserve portion of any disk in the RAID system satisfying the criteria of the present invention. These methods may be performed by a processor in a RAID system executing firmware configured to perform the steps described.

Figure 7:
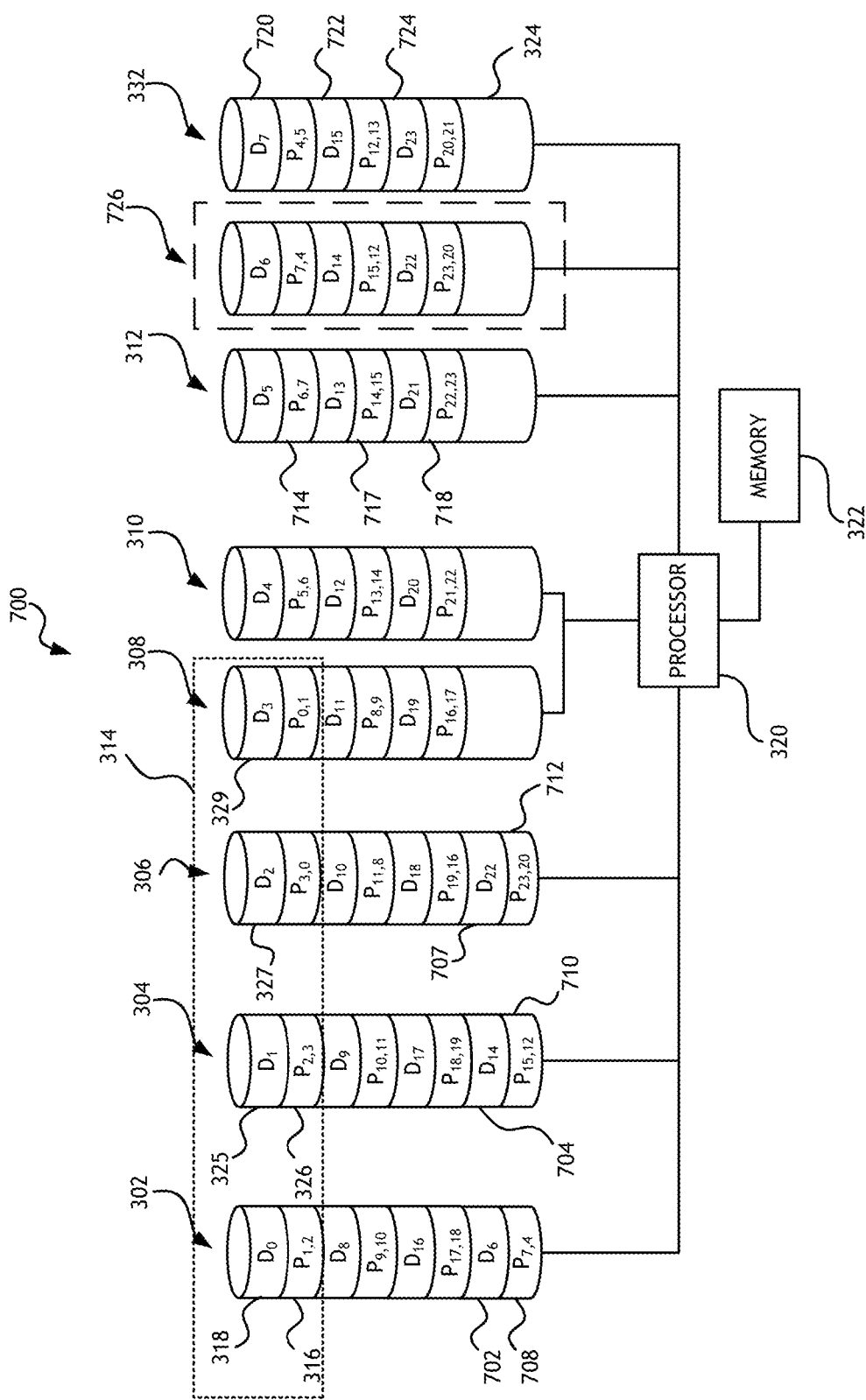
FIG. 7 shows a block diagram of a RAID data storage system having one failed disk, where data from the failed disk has been rebuilt on reserve portions of the remaining disks according to the method of FIG. 6.

Referring to FIG. 7, a RAID system 700 according to the present invention is shown after the data blocks from a single failed disk 726 have been rebuilt on the reserve portions 324 of the remaining disks 302, 304, 306, 308, 312 and 332 of the system 700. Data block $D_6$ of the failed disk 726 may be rebuilt by performing an exclusive disjunction operation on parity block $P_{6,7}$ 714 and data block $D_7$ 720. Rebuild data block $D_6$ 702 may then be stored in the reserve portion 324 of any disk that does not contain a parity block generated from data block $D_6$ or containing a segment in the same stripe as $D_6$. Two of the live disks 310, 312 contain parity blocks generated from data block $D_6$, so rebuilt data block $D_6$ 702 may be stored on any of the remaining live disks 302, 304, 306 or 308. In a separate, unrelated stripe, data block $D_{14}$ may also be rebuilt using the same methodology. Rebuilt data block $D_{14}$ 704 may be stored in the reserve portion 324 of any disk that does not contain a parity block generated from data block $D_{14}$ or containing a segment in the same stripe as $D_{14}$. In a separate, unrelated stripe, data block $D_{22}$ may also be rebuilt using the same methodology. Rebuilt data block $D_{22}$ 707 may be stored in the reserve portion 324 of any disk that does not contain a parity block generated from data block $D_{22}$ or containing a segment in the same stripe as $D_{22}$. Storing each rebuilt data block on a reserve portion of a different disk allows multiple rebuild operations to be carried out concurrently.

After the rebuild operations are complete, data blocks $D_6$ 702, $D_{14}$ 704 and $D_{22}$ 707 remain in the same stripe but are mapped to new physical locations. New parity information may be generated and stored for data blocks $D_6$ 702, $D_{14}$ 704 and $D_{22}$ 707 according to the present invention. New parity information may then be generated for storage in parity blocks 708, 710 and 712 associated with each rebuilt data block.

It is believed that the present invention and many of its attendant advantages will be understood by the foregoing description, and it will be apparent that various changes may be made in the form, construction, and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method of storing parity information in a data storage system comprising:
    storing a first data block in a first segment;
    storing a second data block in a second segment;
    storing a third data block in a third segment;
    generating parity information for at least the first data block and the second data block;
    storing the parity information in a first parity block, wherein:
        the first parity block is stored in the third segment;
        the first segment, the second segment and the third segment define a stripe; and
        the data storage system includes a processor connected to each of the segments, configured to store data blocks and generate parity information.

2. The method of claim 1, further comprising:
    storing a fourth data block in a fourth segment;
    generating parity information for at least the second data block and the third data block;
    storing the parity information in a second parity block, wherein the second parity block is stored in the fourth segment.

3. A method of rebuilding data in a data storage system comprising:
    recovering a first data block from a first parity block containing parity information for at least the first data block and a second data block; and
    writing the recovered first data block to a first reserve portion of one of a plurality of disks in the data storage system,
    wherein:
        the one of the plurality of disks does not contain parity information for the recovered first data block; and
        the first reserve portion is at least large enough to accommodate one segment.

4. The method of claim 3, wherein:
    recovering the first data block comprises performing an exclusive disjunction operation on the first parity block and the second data block; and
    the first parity block was generated by performing an exclusive disjunction operation on the first data block and the second data block.

5. The method of claim 3, further comprising:
    computing new parity information.

6. The method of claim 3, further comprising:
    recovering a third data block from a second parity block containing parity information for at least the first data block and the third data block; and
    writing the recovered third data block to a second reserve portion of one of the plurality of disks in the data storage system,
    wherein:
        the one of the plurality of disks does not contain parity information for the recovered third data block;
        the first data block and the third data block were in the same stripe; and
        the first reserve portion is at least large enough to accommodate one segment.

7. The method of claim 6, further comprising:
    computing new parity information.

8. The method of claim 6, wherein the recovered first data block and the recovered third data block define a stripe in the data storage system.

9. The method of claim 6, further comprising:
    generating a third parity block containing parity information for the recovered first data block; and
    writing the third parity block to a third reserve portion of one of the plurality of disks in the data storage system,
    wherein the third reserve portion does not contain the recovered first data block.

10. The method of claim 3, further comprising:
    recovering a third data block from a second parity block containing parity information for at least the third data block and a fourth data block; and
    writing the recovered third data block to a second reserve portion of one of the plurality of disks in the data storage system,
    wherein:
        the one of the plurality of disks does not contain parity information for the recovered third data block;
        the first data block and the third data block were on the same disk;
        recovering the first data block and recovering the third data block are carried out concurrently; and
        the first reserve portion is at least large enough to accommodate one segment.

11. The method of claim 10, wherein the recovered first data block and the recovered third data block define a stripe in the data storage system.

12. The method of claim 10, further comprising:
    computing new parity information; and
    overwriting the second parity block with the new parity information.

13. An data storage apparatus comprising:
    a processor;
    memory connected to the processor, storing non-transitory computer code; and
    a plurality of disks connected to the processor, each disk having a reserve portion,
    wherein the non-transitory computer code is configured to:
        recover a first data block from a first parity block containing parity information for at least the first data block and a second data block; and
        write the recovered first data block to a first reserve portion of one of the plurality of disks,
        wherein the one of the plurality of disks does not contain parity information for the recovered first data block.

14. The apparatus of claim 13, wherein the non-transitory computer code is further configured to:
  compute new parity information; and
  overwrite the first parity block with the new parity information.

15. The apparatus of claim 13, wherein the non-transitory computer code is further configured to:
  recover a third data block from a second parity block containing parity information for at least the first data block and the third data block; and
  write the recovered third data block to a second reserve portion of one of the plurality of disks,
  wherein:
    the one of the plurality of disks does not contain parity information for the recovered third data block; and
    the first data block and the third data block were in the same stripe.

16. The apparatus of claim 15, wherein the non-transitory computer code is further configured to:
  compute new parity information; and
  overwrite the second parity block with the new parity information.

17. The apparatus of claim 15, wherein the first reserve portion and the second reserve portion define a stripe.

18. The apparatus of claim 15, wherein the non-transitory computer code is further configured to:
  generate a third parity block containing parity information for at least the recovered first data block; and
  write the third parity block to a third reserve portion of one of the plurality of disks in the data storage system,
  wherein the third reserve portion does not contain the recovered first data block.

19. The apparatus of claim 13, wherein the non-transitory computer code is further configured to:
  recover a third data block from a second parity block containing parity information for at least the third data block and a fourth data block; and
  write the recovered third data block to a second reserve portion of one of the plurality of disks in the data storage system,
  wherein:
    the one of the plurality of disks does not contain parity information for the recovered third data block;
    the first data block and the third data block were on the same disk; and
    recovering the first data block and recovering the third data block are carried out concurrently.

20. The apparatus of claim 19, wherein the first reserve portion and the second reserve portion define a stripe in the data storage system.

21. The apparatus of claim 19, wherein the non-transitory computer code is further configured to:
  compute new parity information; and
  overwrite the second parity block with the new parity information.

* * * * *